United States Patent
Liu et al.

(10) Patent No.: US 10,985,224 B2
(45) Date of Patent: Apr. 20, 2021

(54) DISPLAY PANEL AND DISPLAY DEVICE

(71) Applicant: Shanghai Tianma AM-OLED Co., Ltd., Shanghai (CN)

(72) Inventors: Yuhao Liu, Shanghai (CN); Mingzhi Dai, Shanghai (CN); Jinghua Niu, Shanghai (CN)

(73) Assignee: Shanghai Tianma AM-OLED Co., Ltd., Shanghai (CN)

( * ) Notice: Subject to any disclaimer, the term of this patent is extended or adjusted under 35 U.S.C. 154(b) by 0 days.

(21) Appl. No.: 16/729,239

(22) Filed: Dec. 27, 2019

(65) Prior Publication Data

US 2021/0091147 A1    Mar. 25, 2021

(30) Foreign Application Priority Data

Sep. 25, 2019 (CN) .......................... 201910912904.4

(51) Int. Cl.
  *H01L 27/32* (2006.01)
  *H01L 51/52* (2006.01)
  *G02F 1/157* (2006.01)
  *H01L 33/60* (2010.01)

(52) U.S. Cl.
  CPC .......... *H01L 27/3232* (2013.01); *G02F 1/157* (2013.01); *H01L 27/3234* (2013.01); *H01L 27/3276* (2013.01); *H01L 33/60* (2013.01); *H01L 51/5215* (2013.01); *H01L 51/5218* (2013.01); *H01L 51/5293* (2013.01); *G02F 2201/44* (2013.01); *G09G 2300/046* (2013.01); *G09G 2300/0473* (2013.01)

(58) Field of Classification Search
  CPC ..................... H01L 27/3232; G09G 2300/046
  See application file for complete search history.

(56) References Cited

U.S. PATENT DOCUMENTS

2020/0227494 A1* 7/2020 Bae ..................... H01L 27/3248

FOREIGN PATENT DOCUMENTS

CN          109285860 A        1/2019

* cited by examiner

*Primary Examiner* — Farun Lu
(74) *Attorney, Agent, or Firm* — Christensen O'Connor Johnson Kindness PLLC

(57) ABSTRACT

Provided is a display panel having a display area including a first display area and a second display area. The display panel includes: a substrate; an array layer; a display layer including light-emitting elements each including an anode, a light-emitting layer and a cathode that are sequentially stacked; the light-emitting elements comprises first light-emitting elements and second light-emitting elements; a state switching layer located at a side of the display layer facing away from a display surface of the display panel and located in the first display area, wherein in a direction perpendicular to the display panel, the state switching layer overlaps the first light-emitting elements; the state switching layer is switchable between a first state and a second state, and the state switching layer has a smaller light transmittance in the first state than in the second state; and an optical element.

20 Claims, 6 Drawing Sheets

DISPLAY PANEL AND DISPLAY DEVICE

CROSS-REFERENCE TO RELATED APPLICATIONS

The present application claims priority to Chinese Patent Application No. 201910912904.4, filed on Sep. 25, 2019, the content of which is incorporated herein by reference in its entirety.

TECHNICAL FIELD

The present disclosure relates to the technical field of display technologies, and more particularly, to a display panel and a display device.

BACKGROUND

With development of display technologies, demands on smooth use and visual experiences of an electronic product are getting higher, and a high screen occupancy ratio has become a research focus currently. For electronic products, an optical element such as a front camera inevitably occupies a certain space, thus affecting the screen occupancy ratio. In order to achieve a true full screen, the researchers have considered an implementation of the optical element under the screen.

An optical element such as a camera is disposed under a light-emitting element of the display panel, that is, the optical element is disposed in the display area, and a normal display can be achieved at a position where the optical element is disposed. When an optical element is needed, light passes through the display panel to reach the optical element and is finally utilized by the optical element. In a structure of a display panel in the related art, an optical element, when being disposed under the screen, receives little light, thereby affecting an operational performance of an optical module. Therefore, a technical problem that needs to be solved is how to increase an amount of light received by the optical element and thus improve the performance of the optical element under the screen.

SUMMARY

The present disclosure provides a display panel and a display device, aiming to solve the problem of too little light being received by the optical element and an operational performance of the optical element being inferior.

In a first aspect, an embodiment of the present disclosure provides a display panel. The display panel has a display area including a first display area and a second display area. The display panel includes: a substrate; an array layer located on the substrate; a display layer located at a side of the array layer facing away from the substrate, wherein the display layer comprises a plurality of light-emitting elements each comprising an anode, a light-emitting layer and a cathode that are sequentially stacked; the plurality of light-emitting elements comprises first light-emitting elements each comprising a first anode and second light-emitting elements each comprising a second anode, and light transmittance of the first anode is larger than light transmittance of the second anode; the first light-emitting elements are located in the first display area, and the second light-emitting elements are located in the second display area; a state switching layer located at a side of the display layer facing away from a display surface of the display panel and located in the first display area, wherein in a direction perpendicular to the display panel, the state switching layer overlaps the first light-emitting elements; the state switching layer is switchable between a first state and a second state, and the state switching layer has a smaller light transmittance in the first state than in the second state; and an optical element located at a side of the state switching layer facing away from the display layer and located in the first display area.

In a second aspect, the present disclosure provides a display device including the display panel described above.

BRIEF DESCRIPTION OF DRAWINGS

In order to more clearly illustrate technical solutions in embodiments of the present disclosure, the accompanying drawings used in the embodiments are briefly introduced as follows. It should be noted that the drawings described as follows are merely part of the embodiments of the present disclosure, other drawings can also be acquired by those skilled in the art.

DESCRIPTION OF EMBODIMENTS

For better illustrating technical solutions of the present disclosure, embodiments of the present disclosure will be described in detail as follows with reference to the accompanying drawings.

It should be noted that the described embodiments are merely exemplary embodiments of the present disclosure, which shall not be interpreted as limitations to the present disclosure. All other embodiments obtained by those skilled in the art according to the embodiments of the present disclosure fall within the scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that the term "and/or" used herein is merely an association relationship describing associated objects, indicating that there may be three relationships, for example, A and/or B may indicate that three cases, i.e., A existing individually, A and B existing simultaneously, B existing individually. In addition, the character "/" herein generally indicates that the related objects before and after the character form an "or" relationship.

Figure 1:
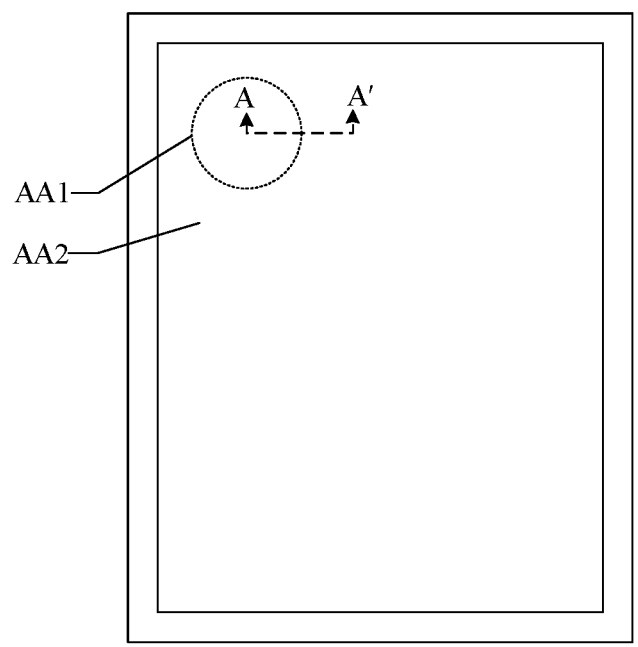
FIG. 1 is a schematic diagram of a display panel according to an embodiment of the present disclosure.

An embodiment of the present disclosure provides a display panel. FIG. 1 is a schematic diagram of a display panel according to an embodiment of the present disclosure, and FIG. 2 is a schematic cross-sectional view along A-A' of FIG. 1 according to an embodiment of the present disclosure.

As shown in FIG. 1, the display panel has a display area that is divided into a first display area AA1 and a second display area AA2. A case as shown in FIG. 1 in which the second display area AA2 surrounds the first display area AA1 is merely a non-limiting example. Optionally, the second display area AA2 may also partially surround the first display area AA1. A shape of the first display area AA1 may be any shape such as a circle, an ellipse, a triangle, a polygon, etc., and can be designed according to actual needs.

Figure 2:
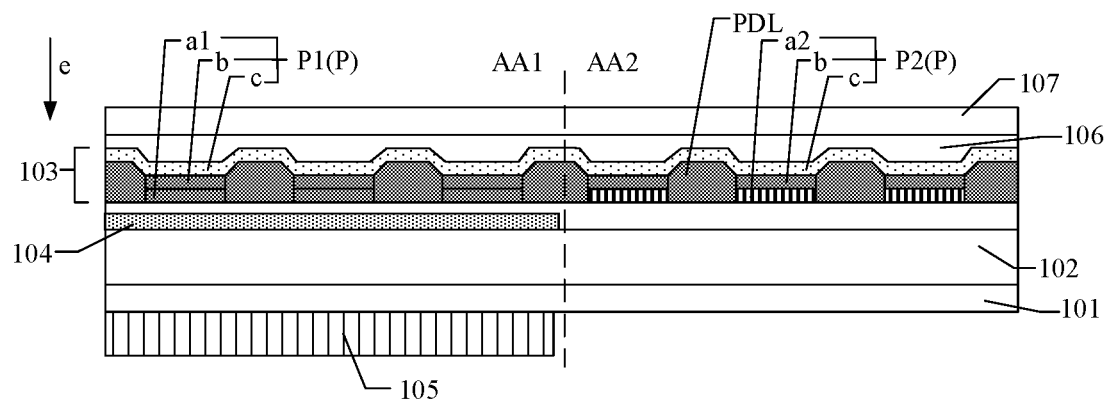
FIG. 2 is a schematic cross-sectional view along A-A' of FIG. 1 according to an embodiment of the present disclosure.

As shown in FIG. 2, the display panel includes: a substrate 101; an array layer 102 located on the substrate 101; a plurality of pixel circuits (not shown in FIG. 2) included in the array layer 102 and electrically connected to light emitting elements P for driving the light-emitting elements P to emit light; and a display layer 103 located on a side of the array layer 102 facing away from the substrate 101. The display layer 103 includes a plurality of light-emitting elements P, each of which includes an anode, a light-emitting layer b and a cathode c that are sequentially stacked. Optionally, each light-emitting element P can further include one or more layers of a hole injection layer, an electron injection layer, a hole transport layer, an electron transport layer, an electron blocking layer, and a hole blocking layer. The light-emitting elements P include a first light-emitting element P1 and a second light-emitting element P2. The first light-emitting element P1 includes a first anode a1, and the second light-emitting element P2 includes a second anode a2. Light transmittance of the first anode a1 is larger than light transmittance of the second anode a2. There is a plurality of first light emitting elements P1 located in the first display area AA1 and a plurality of second light-emitting elements P2 located in the second display area AA2. Optionally, the cathode c of the light-emitting element is a transparent electrode. Light emitted by the first light-emitting element P1 is emitted from the cathode, and light emitted by the second light-emitting element P2 is also emitted from the cathode.

With further reference to FIG. 2, the display panel further includes a state switching layer 104 located on a side of the display layer 103 facing away from a display surface of the display panel and located in the first display area AA1. Here, the display surface of the display panel is a side of display panel displaying an image. In a direction e that is perpendicular to the display panel, the state switching layer 104 overlaps the first light-emitting element P1, and the state switching layer 104 can be switched between a first state and a second state. The light transmittance of the state switching layer 104 in the first state is smaller than the light transmittance of the state switching layer 104 in the second state. The display panel further includes an optical element 105 located on a side of the state switching layer 104 facing away from the display layer 103 and located in the first display area AA1. Optionally, the optical element 105 is a camera. FIG. 2 schematically illustrates a case in which the optical element 105 is located on a side of the substrate 101 facing away from the array layer 102, that is, the state switching layer 104 and the array layer 102 are located between the optical element 105 and the display layer 103.

Optionally, in an implementation embodiment, the optical element 105 may also be located on a side of the state switching layer 104 facing away from the display layer 103. In this implementation embodiment, the array layer 102 is not arranged between the optical element 105 and the display layer 103.

Optionally, as shown in FIG. 2, the display panel further includes an encapsulation structure 106 located on a side of the display layer 103 facing away from the array layer 102. The encapsulation structure 106 may be a thin film encapsulation structure. The encapsulation structure 106 includes at least one organic encapsulation layer and at least one inorganic encapsulation layer. The encapsulation structure 106 has a function of preventing water and oxygen from invading the light-emitting element P in the display layer 103, thereby ensuring a service life of the light-emitting element P. The display panel may further include a polarizer 107 located on the encapsulation structure 106.

Figure 3:
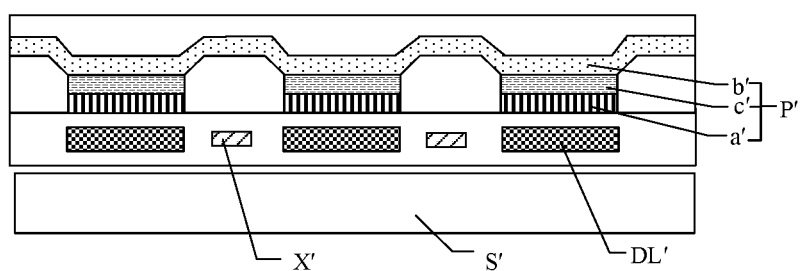
FIG. 3 is a cross-sectional view of a portion of a display panel in the related art.

FIG. 3 is a cross-sectional view of a portion of a display panel in the related art. In a scheme of a camera under the screen in the related art, as shown in FIG. 3, the camera S' is disposed under the light-emitting element P', and the light-emitting element P' includes an anode a', a light-emitting layer b', and a cathode c' that are sequentially stacked. When voltage is applied to the anode a' and the cathode c', the light-emitting layer b' is excited to emit light. The anode a' is usually formed as a reflective anode, and light that reaches the anode a' is reflected by the anode a' and then emitted from the cathode c', thereby increasing a light-emitting efficiency of the light-emitting element P'. In this scheme, most of the light that reaches the anode a' is reflected by the anode a', and the anode a' has very low light transmittance. In a scheme in which the camera is under the screen, it is generally considered that the anode a' is opaque, and ambient light cannot pass through the light-emitting element P', that is, an area where the light-emitting element P' is located is a non-light-transmission area. In the display panel, in general, a pixel circuit DL' (an actual pixel circuit is more complicated, and thus it is simplified in the figure for illustration) electrically connected to the light-emitting element P' is correspondingly disposed under it, and a plurality of signal lines X' (the signal lines shown in the figure also is for illustration) connecting the pixel circuits DL' are further provided in an area between two adjacent light-emitting elements P'. Here, the signal lines X' include at least one of a data line, a scan line, a power signal line and a reset signal line. The signal line X' is also usually made of a metal material, and thus the signal line X' also has a certain preventing effect on the ambient light. Then, an area between two adjacent light-emitting elements P' and provided with no signal line X' is defined as a light-transmitting area, and light has high transmittance when passing through the light-transmitting area. The light-emitting elements P' in the display panel occupy most of space of the display area, and the light-transmitting area corresponding to the camera S' is still relatively small. As a result, there is little light that can be received by the camera S', thereby affecting an imaging performance of the camera in the scheme in which the camera is under the screen.

In the display panel provided by the embodiments of the present disclosure, the light transmittance of the first anode a1 of the first light-emitting element P1 is larger than the light transmittance of the second anode a2 of the second light-emitting element P2, and the light transmittance of the state switching layer 104 in the first state is smaller than the light transmittance of the state switching layer 104 in the second state. Here, the state switching layer 104 is located between the first light-emitting element P1 and the optical element 105. The optical element 105 located in the first display area AA1 may be a camera. In an application of the display panel, when the camera is not enabled, the second light-emitting element P2 in the second display area AA2 normally emits light, and the state switching layer 104 is controlled to be in the first state. The state switching layer 104 has low light transmittance in the first state. The light transmittance of the first anode a1 of the first light-emitting element P1 is larger than the light transmittance of the second anode a2 of the second light-emitting element P2. However, since the state switching layer 104 has low light transmittance in the first state, after part of the light emitted by the first light-emitting element P1 passes through the first anode a1, there is relatively little light that can pass through the state switching layer 104. Most of the light emitted by the first light-emitting element P1 is still emitted from the cathode c, so that the first light-emitting element P1 in the first display area AA1 can also normally emit light, and a full-screen display can be achieved at this time. When the camera is enabled, the second light-emitting element P2 in the second display area AA2 normally emits light, the first light-emitting element P1 in the first display area AA1 is controlled to not emit light, and the state switching layer 104 is controlled to be switched to the second state. In the second state, the light transmittance of the state switching layer 104 is relatively high. Therefore, in this embodiment of the present disclosure, the light transmittance of the first anode a1 of the first light-emitting element P1 is larger than the light transmittance of the second anode a2 of the second light-emitting element P2. When the first light-emitting element P1 does not emit light, the first light-emitting element P1 has certain light transmittance, that is, the ambient light can pass through a part of the film layers of the display panel through the light-transmission area between two adjacent first light-emitting elements P1 and then is utilized by the camera, and the ambient light can also pass through the first light-emitting element P1 and then pass through the state switching layer 104 and is finally utilized by the camera. At this time, an area where the first light-emitting element P1 is located is also a light-transmission area, that is, most of the first display area AA1 is a light-transmission area, which can increase an amount of light that the camera under the screen can receive and thus improve the imaging performance of the camera in the scheme in which the camera is under the screen.

In the display panel provided by this embodiment of the present disclosure, with cooperation between state switching of the state switching layer and whether or not the first light-emitting element emitting light, when the optical element is not used, the state switching layer is switched to the first state, the light-emitting element normally emits light, and the first display area normally performs display, so that the display panel is in a full screen display. When the optical element is used, the first light-emitting element does not emit light, the state switching layer is switched to the second state, and the ambient light can also sequentially pass through the first light-emitting element and the state switching layer and then is utilized by the optical element, so that compared with the related art, an amount of light that the optical element can receive is increased and the use performance of the optical element is improved.

In an embodiment, in the display panel provided by this embodiment of the present disclosure, a pixel density of the first display area is the same as pixel density of the second display area. Here, the pixel density refers to a number of pixels per square inch. In this embodiment of the present disclosure, with cooperation between state switching of the state switching layer and whether or not the first light-emitting element emitting light, when the optical element is used, the ambient light can also sequentially pass through the first light-emitting element and the state switching layer and then is utilized by the optical element, so that the optical element can receive enough light so as to achieve the use performance of the optical element. Thus, in this embodiment of the present disclosure, the pixel density of the first display area and the pixel density of the second display area are not required to be differentiated in design, and thus an image displayed by the display panel can have a consistent resolution.

In an embodiment, in the display panel provided by this embodiment of the present disclosure, the state switching layer has a reflection effect on light in the first state. When the first display area AA1 normally performs as a display, the state switching layer 104 is switched to the first state, the light transmittance of the first anode a1 of the first light-emitting element P1 is larger than the light transmittance of the second anode a2 of the second light-emitting element P2, an amount of light that is emitted by the light-emitting element P1 and then passes through the first anode a1 is larger than an amount of light that is emitted by the second light-emitting element P2 and then passes through the second anode a2. In this embodiment, the state switching layer 104 has a reflection effect on light in the first state, and the state switching layer 104 can reflect the light that passes through the first anode a1, and the light reflected by the state switching layer 104 can pass through the first anode a1 and then is emitted from the cathode c. In this way, a light-emitting efficiency of the first light-emitting element P1 can be improved, so that the first light-emitting element P1 and the second light-emitting element P2 can have substantially the same light-emitting efficiency, and thus the first display area and the second display area can have substantially the same brightness. In this way, display uniformity can be improved, and a display split screen phenomenon can be avoided.

In an embodiment, the first anode is a transparent anode and the second anode is a reflective anode. For example, the first anode is made of one or more materials including a metal, a metal alloy, a metal oxide, and a conductive polymer. The metal may be copper, gold, silver, iron, chromium, nickel, manganese, palladium, platinum, etc. The metal alloy may be an alloy of the metals described above. The metal oxide may be indium oxide, zinc oxide, indium tin oxide, indium zinc oxide, etc. The conductive polymer may be polyaniline, polypyrrole, poly(3-methylthiophene), etc. The second anode may also be made of one or more materials of the metal, the metal alloy, the metal oxide, and the conductive polymer described above. The first anode of the first light-emitting element in this embodiment is formed as a transparent electrode, so that the first anode can function as an electrode while having sufficiently large light transmittance. When the optical element in the display panel is enabled, the first light-emitting element does not emit light, the state switching layer is switched to the second state, and the light transmittance of the state switching layer in the second state is larger than the light transmittance of the state switching layer in the first state. Since the first light-emitting element does not emit light and the first anode of the first light-emitting element is a transparent electrode, the ambient light can sequentially pass through the cathode, the light-emitting layer and the first anode (i.e., the ambient light can pass through the first light-emitting element), then the ambient light can sequentially pass through the first light-emitting element and the state switching layer and then is utilized by the optical element. In this case, the amount of light that the optical element can receive can be increased, thereby improving the use performance of the optical element. When the optical element in the display panel is not enabled, the state switching layer is switched to the first state, part of the light emitted by the first light-emitting element in the first display area passes through the first anode, and the light that passes through the first anode is blocked by the state switching layer, and the light emitted by the first light-emitting element is still emitted from the cathode, so that the first display area can normally perform its display function. As an example, when the state switching layer has a reflection effect on light in the first state, the light returns to the first light-emitting element after being reflected by the state switching layer, and then is emitted from the cathode layer, thereby achieving the light-emitting efficiency of the first light-emitting element. The second anode of the second light-emitting element is a reflective anode. When performing display in the second display area, light emitted by the second light-emitting element towards the second anode is reflected by the second anode and then is emitted from the cathode. In this embodiment, with cooperation between the state switching layer and the transparent anode, it can also achieve that the first light-emitting element and the second light-emitting element have substantially the same light-emitting efficiency, so that the first display area and the second display area can have consistent brightness.

In an embodiment, the light transmittance of the first anode is T, where T≥60%. In this embodiment, with cooperation between the first anode and the state switching layer, when the first light-emitting element is needed to emit light, the state switching layer is switched to the first state, so that most of the light emitted by the first light-emitting element is still emitted from the cathode even if the first anode has relatively large light transmittance, thereby achieving normal display in the first display area; and when the optical element is enabled. Furthermore, the first light-emitting element is controlled to not emit light, the state switching layer is switched to the second state, the light transmittance of the first anode is larger than or equal to 60%, i.e., the light transmittance of the first anode is sufficiently large, then the ambient light has large light transmittance when passing through the first light-emitting element, and the ambient light can still pass through the state switching layer in the second state after passing through the first light-emitting element and finally is utilized by the optical element. The ambient light has large light transmittance when sequentially passing through the first light-emitting element and the state switching layer, and thus an amount of light that the optical element under the screen can receive can be increased.

In an embodiment, T≥80%. In this embodiment, the light transmittance of the first light-emitting element can be further increased. When the optical element is enabled, the light transmittance of the ambient light sequentially passing through the first light-emitting element and the state switching layer can be further increased, thereby further increasing the amount of light that the optical element receives.

Figure 4:
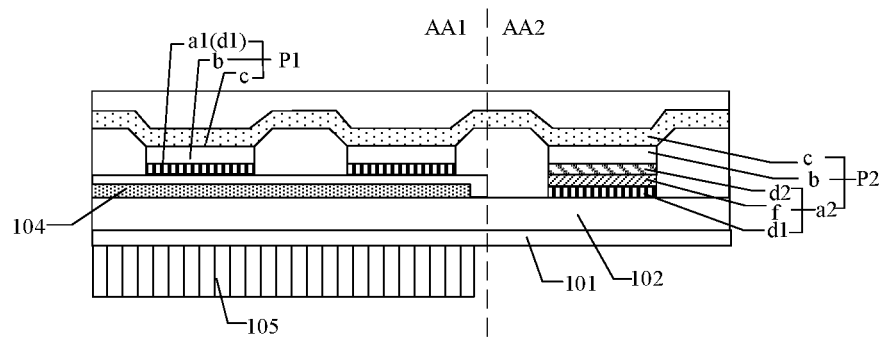
FIG. 4 is a schematic cross-sectional view along A-A' of FIG. 1 according to another embodiment of the present disclosure.

FIG. 4 is a schematic cross-sectional view along A-A' of FIG. 1 according to another embodiment of the present disclosure. In an embodiment, as shown in FIG. 4, the second anode a2 includes a first conductive layer d1, a reflective layer f and a second conductive layer d2 that are sequentially stacked. The first anode a1 includes a first conductive layer d1. In this embodiment, the first conductive layer d1 of the first anode a1 and the first conductive layer d1 of the second anode a2 may be formed in a same process. A thickness of the first anode is smaller than a thickness of the second anode, so that the light transmittance of the first anode is larger than the light transmittance of the second anode. Moreover, different from the second anode, the first anode does not include the reflective layer, thereby further ensuring the light transmittance of the first anode. When the first light-emitting element does not emit light, the ambient light has sufficiently large transmittance when passing through the first light-emitting element, and when the optical element is used and the state switching layer is in the second state, the amount of light that the optical element receives is increased. Moreover, since the thickness of the first anode is smaller than the thickness of the second anode, then a thickness of the first light-emitting element is smaller than a thickness of the second light-emitting element in a thickness direction of the display panel. In this way, a certain space can be reserved in the thickness direction for the state switching layer and/or optical element disposed in the first display area. For example, the first conductive layer is made of a material including indium tin oxide (ITO) or indium gallium zinc oxide (IGZO), and the second conductive layer is made of a material including indium tin oxide or indium gallium zinc oxide. The material of the first conductive layer and the material of the second conductive layer may be the same or different.

The reflective layer is made of a material including silver (Ag).

In an embodiment, the second anode includes ITO, Ag, ITO that are sequentially stacked. The first anode includes ITO. Here, a thickness of ITO is 10 nm, and a thickness of Ag is 100 nm.

In another embodiment, the first anode includes a second conductive layer. In another embodiment, the first anode includes a first conductive layer and a second conductive layer.

Figure 5:
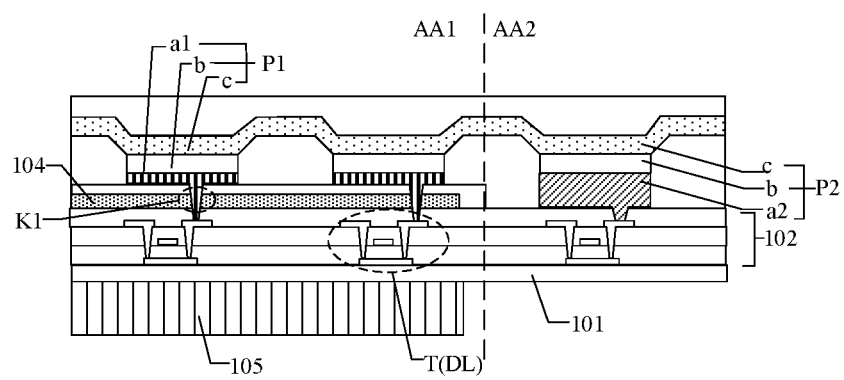
FIG. 5 is a schematic cross-sectional view along A-A' of FIG. 1 according to another embodiment of the present disclosure.

FIG. 5 is a schematic cross-sectional view along A-A' of FIG. 1 according to another embodiment of the present disclosure. In an embodiment, as shown in FIG. 5, the optical element 105 is located on a side of the array layer 102 facing away from the state switching layer 104. The array layer 102 includes a plurality of pixel circuits DL, and the pixel circuits DL are electrically connected to the light-emitting elements. An actual pixel circuit DL has a more complicated structure, and only one transistor T of the pixel circuit DL is schematically illustrated in the drawings. In this embodiment, the pixel circuit is disposed under the light-emitting element. In the first display area AA1, the state switching layer 104 is disposed between the array layer 102 and the first light-emitting element P1, and a hole K1 is needed to be formed in the state switching layer 104 so as to achieve an electrical connection between the first light-emitting element P1 and the pixel circuit DL. In this embodiment, when the optical element is not enabled, the state switching layer is controlled to be in the first state, and the first light-emitting element normally emits light, so that display may be performed simultaneously in the first display area and the second display area, that is, a full screen display can be achieved. When the optical element is enabled, the state switching layer is controlled to be in the second state, and the first light-emitting element does not emit light, the first light-emitting element has certain light transmittance, and the ambient light can sequentially pass through the first light-emitting element and the state switching layer and the array layer and then is utilized by the optical element, so that the amount of light that the optical element under the screen can receive can be increased. Moreover, in this embodiment, a layout of the pixel circuit in the array layer does not need to be changed in design, and thus a manufacturing process thereof may remain relatively simple.

Figure 6:
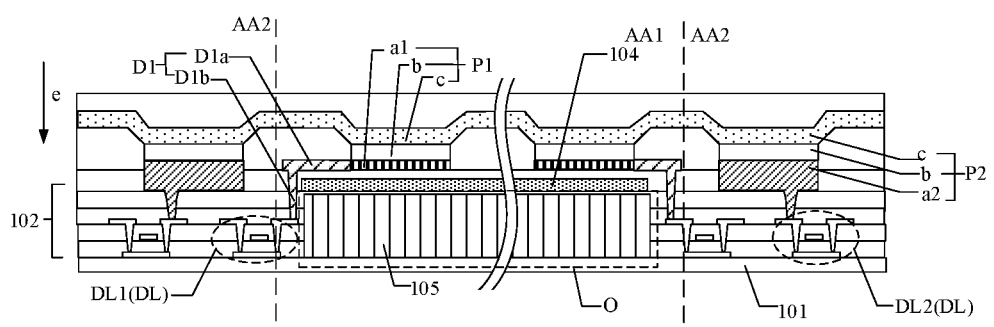
FIG. 6 is a cross-sectional view of a display panel according to another embodiment of the present disclosure.

FIG. 6 is a cross-sectional view of a display panel according to another embodiment of the present disclosure. In an embodiment, as shown in FIG. 6, the array layer 102 includes a recess O, the recess O is located in the first display area AA1, and the optical element 105 is located in the groove O. The array layer 102 includes a plurality of pixel circuits DL, which includes a first pixel circuit DL1 electrically connected to the first light-emitting element P1 and a second pixel circuit DL2 electrically connected to the second light-emitting element P2. In the direction e that is perpendicular to the display panel, the first pixel circuit DL1 does not overlap the first light-emitting element P1. It should be noted that a structure of the pixel circuit in the actual product is more complicated, and only one transistor of the pixel circuit is schematically illustrated in FIG. 6. In this embodiment, the array layer includes the recess and the optical element is located in the recess, and no pixel circuit is arranged between the optical element and the first light-emitting element. When the optical element is enabled, the first light-emitting element does not emit light, the state switching layer is switched to the second state, and after sequentially passing through the first light-emitting element and the state switching layer, the ambient light can be utilized by the optical element without passing through the array layer. In this way, light loss of the ambient light when passing through the array layer then can be reduced, thereby further increasing the amount of light that the optical element can receive. Moreover, placing the optical element in the recess of the array layer is beneficial to thinning of the display panel. For example, in this embodiment, the thickness of the first anode of the first light-emitting element is smaller than the thickness of the second anode of the second light-emitting element. For example, the second anode includes a first conductive layer, a reflective layer, and a second conductive layer that are sequentially stacked, and the first anode includes a first conductive layer and/or a second conductive layer. A differential design between the first anode and the second anode also allows a certain space to be reserved in the thickness direction for the optical element disposed in the recess.

It should be noted that, in the implementation manner corresponding to FIG. 6, the first pixel circuit DL1 and the first light-emitting element P1 do not overlap in the direction e that is perpendicular to the display panel. An arrangement of pixel circuits DL in the array layer 102 can be designed, for example, the first pixel circuit DL1 is arranged in an area of the array layer 102 surrounding the recess O, as shown in FIG. 6, and at least part of the second pixel circuit DL2 is unaligned with the second light-emitting element P2, that is, in the direction e that is perpendicular to the display panel, the second pixel circuit DL2 is unaligned with the second light-emitting element P2. In this way, when the array layer 102 is provided with the recess O, the first light-emitting element and the second light-emitting element can be driven by using an arrangement of the pixel circuits. The arrangement of pixel circuits in the array layer is not limited herein by this embodiment, and the arrangement of pixel circuits can be designed according to a specific shape of the recess, a number of the first pixel circuits, a position of the first display area in the display panel, and the like.

With further reference to FIG. 6, the first light-emitting element P1 is electrically connected to the first pixel circuit DL1 through the first wire D1, and the first wire D1 includes a first sub-wire D1a and a second sub-wire D1b electrically connected to each other. The first sub-wire D1a is located in the first display area AA1, and at least part of the second sub-wire D1b is located in the array layer 102. The first anode a1 of the first light-emitting element P1 is electrically connected to an end of the first sub-wire D1a, the other end of the first sub-wire D1a is electrically connected to an end of the second sub-wire D1b, and the other end of the second sub-wire D1b is electrically connected to the first pixel circuit. DL. In this embodiment, the first pixel circuit DL1 does not overlap the first light-emitting element P1. To achieve an electrical connection between the first light-emitting element P1 and the first pixel circuit DL1, the first wire D1 is provided in the display panel. As shown in FIG. 6, at a position adjacent to the second display area AA2, the first wire D1 is led out from the first anode a1 and then is wound around an external side of the optical element 105 to be electrically connected to the first pixel circuit DL1. For the first light-emitting element P1 not adjacent to the second display area AA2, the first wire D1 electrically connected thereto needs to extend to an edge position of the first display area AA1 after being wound within the first display area AA1 (i.e., the first sub-wire is wound within the first display area AA1 and then extends to the edge of the first display area AA1), and then is wound around an external side of the optical element 105 to be electrically connected to first pixel circuit DL1. Such winding is merely described herein in words and not illustrated in the drawings.

As an example, the first sub-wire D1a can be made of a transparent conductive material. The transparent conductive material includes at least one of indium tin oxide (ITO), indium gallium zinc oxide (IGZO), and a nano silver line. When the first sub-wire D1a is wound in the first display area AA1, at least part of the first sub-wire D1a needs to be routed between two adjacent first light-emitting elements P1. The first sub-wire D1a is made of a material including a transparent conductive material, and then light has a relatively large transmittance when passing through the first sub-wire D1a. This embodiment can ensure the light transmittance of the light-transmission area between two adjacent first light-emitting elements P1 when the optical element 105 is enabled, thereby preventing the arrangement of the first sub-wire from causing a large loss of light when the ambient light passes through the first display area AA1.

In an embodiment, the first sub-wire D1a and the first anode a1 are made in a same layer and of a same material. This embodiment can achieve a relatively high transmittance when light is passing through the first sub-wire D1a. When the optical element 105 is enabled, the light transmittance of the light-transmission area between two adjacent first light-emitting elements P1 can be ensured, thereby preventing the arrangement of the first sub-wire from causing a large loss of light when the ambient light passes through the first display area AA1. Meanwhile, the first sub-wire D1a and the first anode a1 can be made of a same material in a same process, and thus a manufacturing process thereof remains simple.

In the display panel provided by this embodiment of the present disclosure, the state switching layer can be formed in an entire layer in the first display area, or the state switching layer can be divided into a plurality of state switching units, and corresponding setting manners of the state switching layer will be illustrated in the following embodiments.

Figure 7:
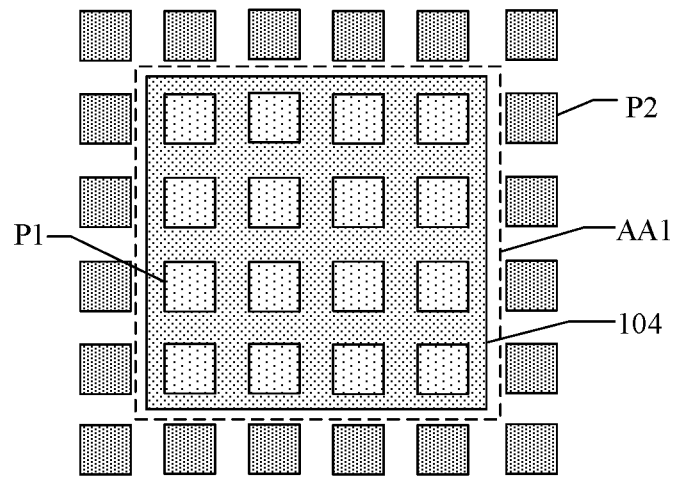
FIG. 7 is a top view of a portion of a display panel according to an embodiment of the present disclosure.

FIG. 7 is a top view of a portion of a display panel according to an embodiment of the present disclosure. In an embodiment, as shown in FIG. 7, the state switching layer 104 is formed as a continuous structure in a plane parallel to the display panel. FIG. 7 is a top view of a portion of a display panel, and a direction of the top view is the same as the direction perpendicular to the display panel. As can be seen from the figure, in the direction perpendicular to the display panel, the state switching layer 104 overlaps all first light-emitting elements P1. The shapes of the first display area AA1 and the state switching layer 104 in the top view are merely schematically shown. In this embodiment, the state switching layer with a continuous structure is arranged in the first display area, and the state switching layer does not need to be formed differently at different positions in the first display area, and thus a manufacturing process thereof remains simple. Moreover, when the state switching layer is controlled to perform state switching, an overall control of the state switching layer in the first display area can be achieved. The state switching layer corresponding to all first light-emitting elements in the first display area has a same switching rule, and a display control manner of the display panel is also simpler. In other words, when the optical element is not enabled, all first light-emitting elements are controlled to emit light, the state switching layer is switched to the first state, and a full screen display can be achieved. When the optical element is enabled, all first light-emitting elements are controlled to not emit light, and the state switching layer is switched to the second state, thereby increasing the light transmittance of the first display area and thus increasing the amount of light that the optical element can receive.

Figure 8:
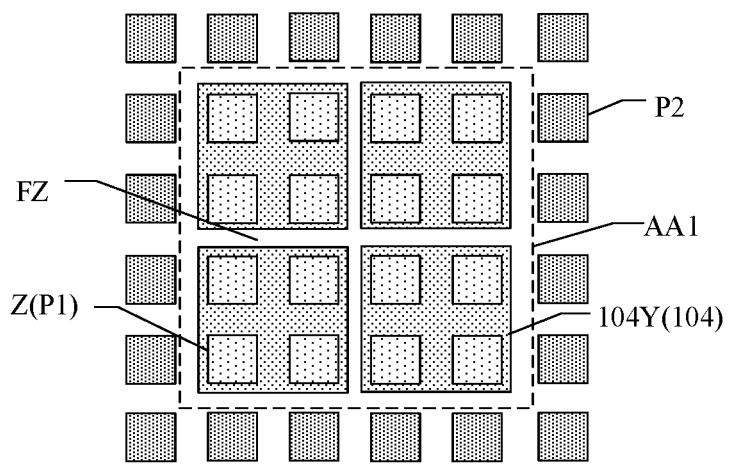
FIG. 8 is a top view of a portion of a display panel according to another embodiment of the present disclosure.

FIG. 8 is a top view of a portion of a display panel according to another embodiment of the present disclosure. In an embodiment, as shown in FIG. 8, the first display area AA1 includes a pixel area Z and a non-pixel area FZ surrounding the pixel area Z. The first light-emitting element P1 is located in the pixel area Z. The non-pixel area FZ is a spacing between two adjacent first light-emitting elements P1. With reference to the cross-sectional view in FIG. 2 described above, the display layer 103 further includes a pixel definition layer PDL for allowing adjacent first light-emitting elements P1 to be spaced apart from one another. The pixel definition layer PDL includes an aperture area (not labeled) and the non-aperture area (not labeled), where the pixel area Z is the aperture area and the non-pixel area FZ is the non-aperture area. The state switching layer 104 includes a plurality of state switching units 104Y. FIG. 8 is a top view of a portion of a display panel, and a direction of the top view is the same as the direction perpendicular to the display panel. As can be seen from the figure, in the direction perpendicular to the display panel, at least part of the non-pixel area FZ does not overlap the state switching units 104Y. In this embodiment, the state switching layer is divided into a plurality of state switching units, and at least part of the non-pixel area does not overlap the state switching units. That is, in the first display area, at least part of the non-pixel area is provided with no state switching layer in terms of the film structure. In this case, the ambient light does not need to pass through the state switching layer when the ambient light passes through this part of non-pixel area, thereby increasing the transmittance of this area when the ambient light passes through this part of non-pixel area and further increasing the amount of light that the optical element under the screen can receive.

In the direction perpendicular to the display panel, one state switching unit overlaps n first light-emitting elements, where n≥2. With further reference to FIG. 8, it is schematically illustrated that one state switching unit 104Y overlaps four first light-emitting elements P1. In the first display area AA1, a number of the first light-emitting elements P1 overlapping each state switching unit 104Y may be the same or different. In this embodiment, one state switching unit overlaps multiple first light-emitting elements. When the display panel is in an application, the state switching unit is switched to the first state, and the first light-emitting element emits light, so that normal display is performed in an area where this state switching unit is located; and the state switching unit is switched to the second state, and the first light-emitting element does not emit light, so that the area where this state switching layer is located has large light transmittance. When the state switching layer is divided into a plurality of state switching units, the first display area is divided into a plurality of unit display areas corresponding to the state switching units (i.e., each state switching unit corresponds to one unit display area). With cooperation between the state switching unit and the first light-emitting element that overlap each other, each unit display area can be individually controlled. For example, normal display can be performed in a part of display unit areas while no display is performed in the remaining unit display areas (when no display is performed in these remaining unit display areas, it means that they can be used as light-transmission areas for increasing the amount of light that the optical element under the screen can receive). By performing normal display function in part of display unit areas while not performing display function in the remaining unit display areas, display diversification can be achieved. Meanwhile, when the optical element is enabled, the amount of light that the optical element can receive can be controlled by controlling a number of unit display areas where no display is performed.

Figure 9:
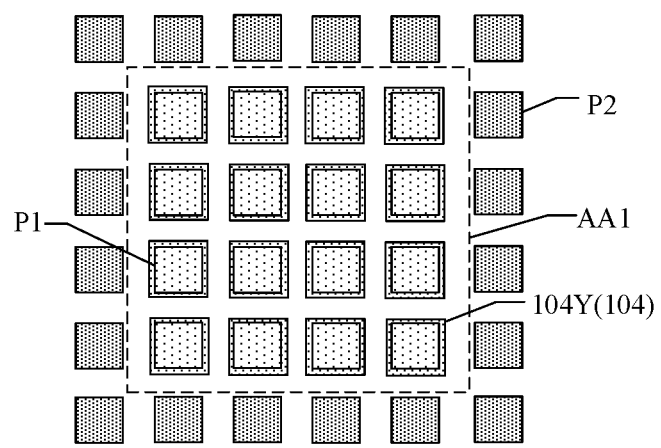
FIG. 9 is a top view of a portion of a display panel according to another embodiment of the present disclosure.

FIG. 9 is a top view of a portion of a display panel according to another embodiment of the present disclosure. In an embodiment, as shown in FIG. 9, each first light-emitting element P1 overlaps a respective one state switching unit 104Y in the direction perpendicular to the display panel. Each state switching unit overlaps a respective one first light-emitting element. When the display panel is in an application, the first light-emitting element emits light and the state switching unit is switched to the first state, so that normal display is performed in the area where the first light-emitting element is located; and the first light-emitting element does not emit light and the state switching unit is switched to the second state, so that the area where the first light-emitting element is located has a relatively large transmittance. Further, in this embodiment, by dividing the state switching layer into a plurality of areas and each state switching unit corresponding to a respective one first light-emitting element, which is equivalent to dividing the first display area into a plurality of unit display areas corresponding to the first light-emitting elements. With cooperation between the state switching unit and the first light-emitting element that overlap each other, each unit display area can be individually controlled. In this embodiment, an area (i.e., non-pixel area) between two adjacent first light-emitting elements may be provided with no state switching layer. In this case, the ambient light does not need to pass through the state switching layer when passing through this part of the non-pixel area, thereby increasing the transmittance of this area when the ambient light passes through this part of non-pixel area, and further increasing the amount of light that the optical element under the screen can receive.

Figure 10:
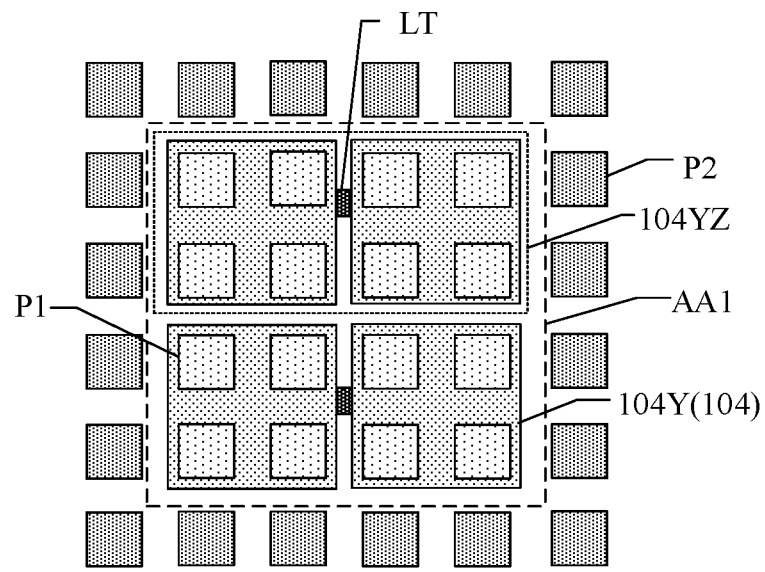
FIG. 10 is a top view of a portion of a display panel according to another embodiment of the present disclosure.

FIG. 10 is a top view of a portion of a display panel according to another embodiment of the present disclosure. In an embodiment, as shown in FIG. 10, at least two adjacent state switching units 104Y are connected by a communication part LT to form a state switching unit group 104YZ. The figure merely schematically illustrates a case in which one state switching unit 104Y overlaps four first light-emitting elements P1. For example, when the state switching unit 104Y is controlled to be switched between the first state and the second state by means of an electrical signal, the communication unit LT can achieve communication between all state switching units 104Y in the state switching unit group. When the state is controlled to be switched by an electrical signal, each part of each state switching unit 104Y in the state switching unit group can be uniformly switched, and a state switching speed of the state switching layer can be increased.

In an embodiment, the communication part and the state switching unit are made of a same material, and the communication part and the state switching unit may be made of a same material in a same process, and a manufacturing process thereof remains simple. In an embodiment, the communication part may be made of a transparent conductive material. In this embodiment of the present disclosure, the state switching unit overlaps the first light-emitting element, and at least part of the communication part is located in the area (i.e., non-pixel area) between two adjacent first light-emitting elements. The communication part is made of a transparent conductive material, so that electrical conductivity between the two state switching units connected by the communication part can be achieved while achieving a large transmittance of the ambient light passing through the communication part. The communication part has no influence on the amount of light that the optical element under the screen can receive.

Figure 11:
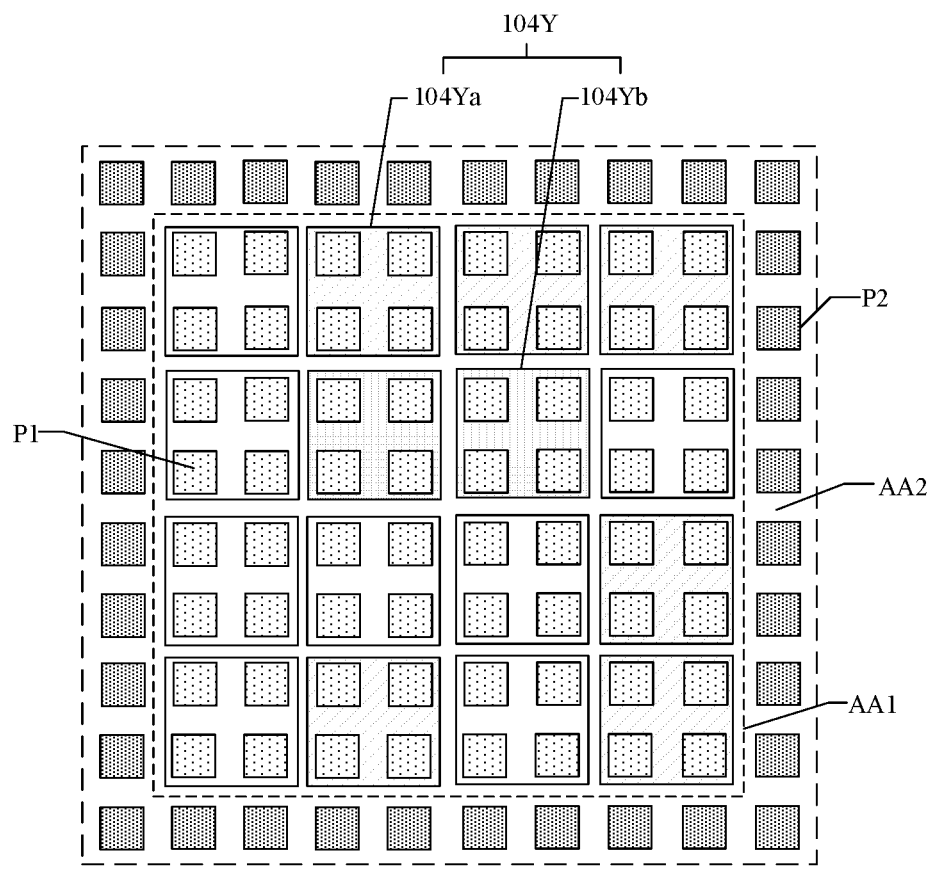
FIG. 11 is a top view of a portion of a display panel according to another embodiment of the present disclosure.

FIG. 11 is a top view of a portion of a display panel according to another embodiment of the present disclosure. In an embodiment, as shown in FIG. 11, a plurality of state switching units 104Y includes first state switching units 104Ya and second state switching units 104Yb. In a direction from the second display area AA2 towards the first display area AA1, the second state switching units 104Yb are located at a side of the first state switching units 104Ya facing away from the second display area AA2. The display panel has a first use state, in which one of the first state switching unit 104Ya and the second state switching unit 104Yb is in a first state while the other one of the first state switching unit 104Ya and the second state switching unit 104Yb are in a second state. The shape of the first display area AA1 in FIG. 11 is merely illustrative. The figure shows that the first state switching unit 104Ya and the second state switching unit 104Yb each overlaps four first light-emitting elements P1, but actually, a number of first light-emitting elements P1 overlapping the first state switching unit 104Ya may be the same as or different from a number of first light-emitting elements P1 overlapping the second state switching unit 104Yb. In an example as shown in FIG. 11, in one first use state, the first state switching unit 104Ya is in the first state and the first light-emitting element P1 overlapping the first state switching unit 104Ya may or may not emit light, and the second state switching unit 104Yb is in the second state and the first light-emitting element P1 corresponding to the second state switching unit 104Yb does not emit light. In this use state, ambient light has a relatively larger transmittance when passing through the area corresponding to the second state switching unit 104Yb and has a relatively small transmittance or even cannot be utilized by the optical element when passing through the first state switching unit 104Ya. In another first use state, the second state switching unit 104Yb is in the first state and the first light-emitting element P1 overlapping the second state switching unit 104Yb may or may not emit light, and the first state switching unit 104Ya is the second state and the first light-emitting element P1 corresponding to the first state switching unit 104Ya does not emit light, and in this use state, ambient light has a relatively larger transmittance when passing through the area corresponding to the first state switching unit 104Ya and has a relatively small transmittance or even cannot be utilized by the optical element when passing through the second state switching unit 104Yb. In the two first use states described above, the optical element under the screen can receive different amount of light, and the area where the optical element under the screen can receive light is also different. The display panel further has a second use state. In the second use state, the first state switching unit 104Ya and the second state switching unit 104Yb are both in the second state, and the first light-emitting elements P1 corresponding to the first state switching unit 104Ya and the second state switching unit 104Yb do not emit light. In this use state, ambient light has a relatively large transmittance when passing through the area corresponding to the first state switching unit 104Ya and has a relatively large transmittance when passing through the second state switching unit 104Yb. In this embodiment, by controlling cooperation between the first state switching unit and the first light-emitting element overlapping the first state switching unit and controlling cooperation between the second state switching unit and the first light-emitting element overlapping the second state switching unit, the display panel can have different use states. In different use states, it is different in terms of the area where the optical element under the screen receives ambient light. For example, when the optical element is a camera, the camera can shoot at different viewing angles in different use states, and this embodiment can achieve switching of the camera under different viewing angles.

Figure 12:
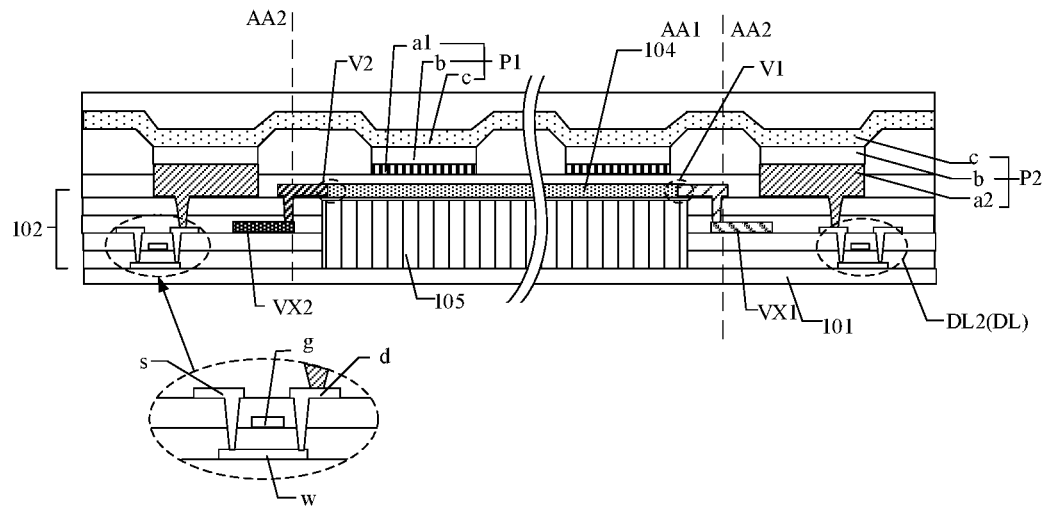
FIG. 12 is a diagram illustrating a film layer structure of a display panel according to another embodiment of the present disclosure.

In the display panel provided by this embodiment of the present disclosure, switching of the state switching layer between the first state and the second state may be implemented by applying a voltage to the state switching layer. FIG. 12 is a diagram illustrating a film layer structure of a display panel according to another embodiment of the present disclosure. In an embodiment, as shown in FIG. 12, the state switching layer 104 includes a first voltage terminal V1 and a second voltage terminal V2. The array layer 102 includes a first voltage signal line VX1 for providing a first voltage signal, and a second voltage signal line VX2 for providing a second voltage signal. The first voltage terminal V1 is electrically connected to the first voltage signal line VX1, and the second voltage terminal V2 is electrically connected to the second voltage signal line VX2. The first voltage signal and the second voltage signal have different magnitudes. For example, when the optical element is not enabled, neither the first voltage terminal V1 nor the second voltage terminal V2 receives a voltage signal, and the state switching layer 104 is in the first state. When the optical element is enabled, the first voltage terminal V1 receives the first voltage signal provided on the voltage signal line VX1, the second voltage terminal V2 receives the second voltage signal provided on the second voltage signal line VX2, and the state switching layer 10 is switched to the second state.

As an example, the display panel further includes a driving chip. The first voltage signal line VX1 and the second voltage signal line VX2 each are electrically connected to a pin on the driving chip, thereby allowing the driving chip to implement switching of the state switching layer 104 between the first state and the second state.

With further reference to FIG. 12, the array layer 103 includes a plurality of transistors each including an active layer w, a source electrode s, a drain electrode d, and a gate electrode g. The array layer includes a semiconductor layer, a gate metal layer, and a source-drain metal layer. The active layer w is located in the semiconductor layer, the gate electrode g is located in the gate metal layer, and the source electrode s and the drain electrode d are located in the source-drain metal layer. The figure merely illustrates a case in which the first voltage signal line VX1 and the second voltage signal line VX2 are located in the same film layer as the source electrode s and the drain electrode d of the transistor. In an embodiment, the first voltage signal line VX1 and the second voltage signal line VX2 are located in the same film layer as the gate electrode g of the transistor.

FIG. 12 merely illustrates an example in which the state switching layer corresponds to the embodiment of FIG. 7. In an embodiment in which the state switching layer 104 is formed as a continuous structure in the first display area AA1, the state switching layer 104 includes at least one first voltage terminal V1 and at least one second voltage terminal V2. The state switching layer 104 is switched between the first state and the second state by controlling a voltage signal applied to the first voltage terminal V1 and the second voltage terminal V2.

In the embodiment corresponding to FIG. 8, FIG. 9, and FIG. 11, the state switching layer 104 includes a plurality of state switching units 104Y, and each state switching unit includes at least one first voltage terminal V1 and at least one second voltage terminal V2. The state switching unit 104Y is switched between the first state and the second state by controlling a voltage signal applied to the first voltage terminal V1 and the second voltage terminal V2.

In the embodiment corresponding to FIG. 10, each state switching unit may include at least one first voltage terminal V1 and at least one second voltage terminal V2. It is also possible that one state switching unit group 104YZ includes one first voltage terminal V1 and one second voltage terminal V2.

Figure 13:
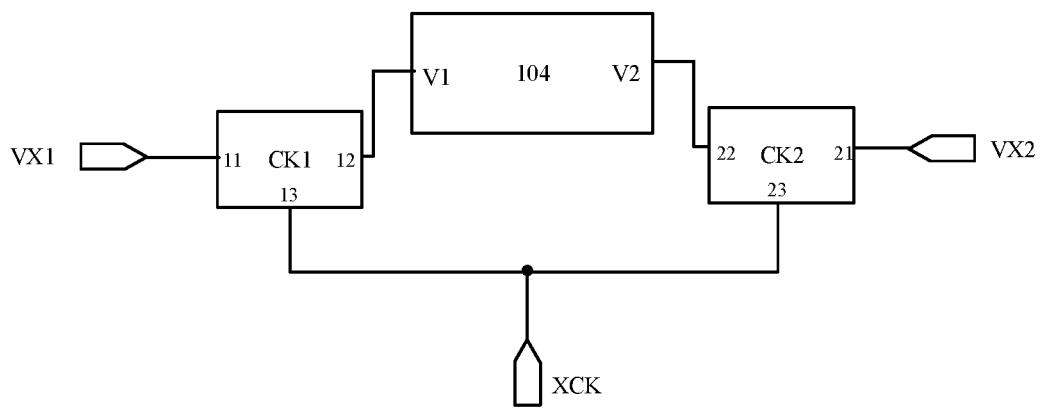
FIG. 13 is a schematic diagram of a control circuit of a state switching layer of a display panel according to an embodiment of the present disclosure.

FIG. 13 is a schematic diagram of a control circuit of a state switching layer of a display panel according to an embodiment of the present disclosure. In an embodiment, as shown in FIG. 13, the state switching layer 104 includes a first voltage terminal V1 and a second voltage terminal V2. The array layer further includes a first control unit CK1 and a second control unit CK2. The first control unit CK1 includes an input terminal 11 electrically connected to the first voltage signal line VX1, and an output terminal 12 electrically connected to the first voltage terminal V1. The second control unit CK2 includes an input terminal 21 electrically connected to the second voltage signal line VX2, and an output terminal 22 electrically connected to the second voltage terminal V2. The array layer further includes a control signal line XCK, and a control terminal 13 of the first control unit CK1 and a control terminal 23 of the second control unit CK2 are electrically connected to the control signal line XCK.

Figure 14:
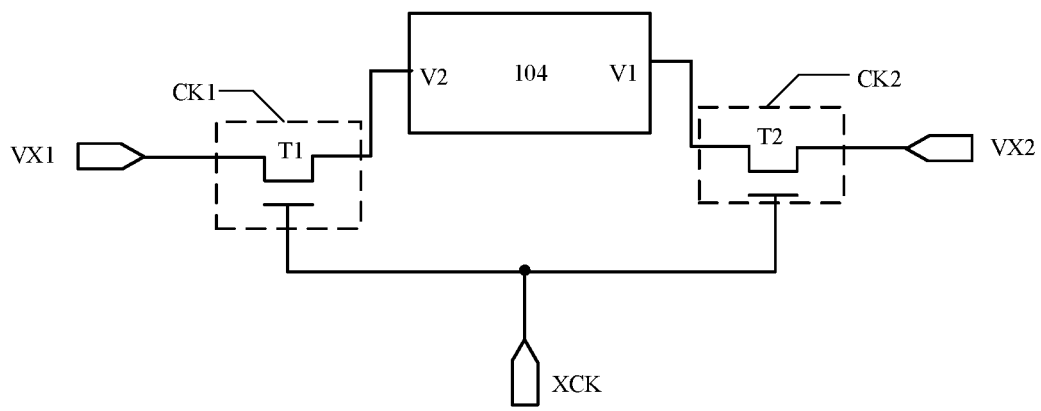
FIG. 14 is a schematic diagram of a control circuit of a state switching layer of a display panel according to another embodiment of the present disclosure.

FIG. 14 is a schematic diagram of a control circuit of a state switching layer of a display panel according to another embodiment of the present disclosure. In an embodiment, as shown in FIG. 14, the first control unit CK1 includes a first transistor T1. The first transistor T1 includes a control terminal (i.e., a gate electrode of the transistor) electrically connected to the control signal line XCK, a first terminal (for example a source terminal) electrically connected to the first voltage signal line VX1, and a second terminal (for example a drain terminal) electrically connected to the first voltage terminal V1. The second control unit CK2 includes a second transistor T2. The second transistor T2 includes a control terminal (i.e., a gate electrode of the transistor) electrically connected to the control signal line XCK, a first terminal (for example a source terminal) electrically connected to the second voltage signal line VX2, and a second terminal (fort example a drain terminal) electrically connected to the second voltage terminal V2.

The state switching of the state switching layer is implemented by common control of the first control unit and the second control unit as illustrated in the foregoing embodiments corresponding to FIG. 13 or FIG. 14, and the same applies to the embodiments corresponding to FIG. 8, FIG. 9 and FIG. 11. The state switching layer includes a plurality of state switching units, and state switching of each state switching unit can be implemented by common control of the first control unit and the second control unit, and details thereof are not further described herein.

In an embodiment, the state switching layer includes an electrochromic thin film. Optionally, the electrochromic thin film is made of a material including an inorganic electrochromic material such as tungsten oxide or nickel oxide. Alternatively, the electrochromic thin film may be made of a material including an organic electrochromic material. When no voltage signal is applied to the first voltage terminal and the second voltage terminal of the state switching layer, the state switching layer is in the first state. When a voltage signal is applied to the first voltage terminal and the second voltage terminal of the state switching layer, the state switching layer is switched to the second state. The electrochromic thin film can reversibly change its color under an external electric field. The state switching of the state switching layer can be easily controlled, and a switching speed is fast when being controlled by a voltage signal.

Figure 15:
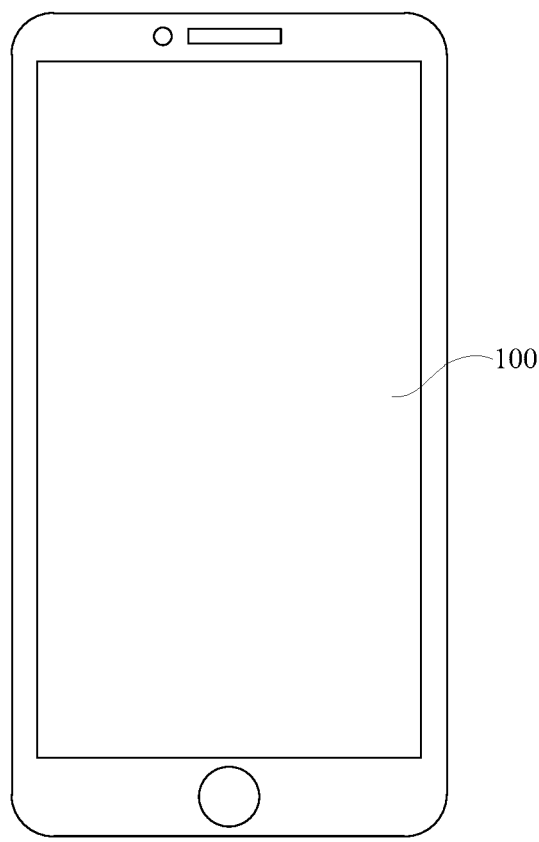
FIG. 15 is a schematic diagram of a display device according to an embodiment of the present disclosure.

The present disclosure further provides a display device based on the above-described inventive concepts. FIG. 15 is a schematic diagram of a display device according to an embodiment of the present disclosure. As shown in FIG. 15, the display device includes the display panel 100 provided by any embodiment of the present disclosure. A structure of the display panel 100 has been described in detail in the above embodiments, and will not be further described herein. It should be noted that the display device shown in FIG. 15 is merely illustrative, and the display device can be any electronic device having a display function such as a mobile phone, a tablet computer, a notebook computer, an electronic paper book, or a television.

The above-described embodiments are merely preferred embodiments of the present disclosure and are not intended to limit the present disclosure. Any modifications, equivalent substitutions and improvements made within the principle of the present disclosure shall fall into the protection scope of the present disclosure.

What is claimed is:

1. A display panel having a display area comprising a first display area and a second display area, the display panel comprising:
a substrate;
an array layer located on the substrate;
a display layer located at a side of the array layer facing away from the substrate, wherein the display layer comprises a plurality of light-emitting elements each comprising an anode, a light-emitting layer and a cathode that are sequentially stacked; wherein the plurality of light-emitting elements comprises first light-emitting elements each comprising a first anode and second light-emitting elements each comprising a second anode, and wherein light transmittance of the first anode is larger than light transmittance of the second anode; wherein the first light-emitting elements are located in the first display area, and wherein the second light-emitting elements are located in the second display area;
a state switching layer located at a side of the display layer facing away from a display surface of the display panel and located in the first display area, wherein in a direction perpendicular to the display panel the state switching layer overlaps the first light-emitting elements; wherein the state switching layer is switchable between a first state and a second state, and wherein the state switching layer has a smaller light transmittance in the first state than in the second state; and
an optical element located at a side of the state switching layer that is facing away from the display layer and is located in the first display area.

2. The display panel according to claim 1,
wherein the state switching layer is formed as a continuous structure on a plane parallel with the display panel; and
wherein the state switching layer overlaps all of the first light-emitting elements in the direction perpendicular to the display panel.

3. The display panel according to claim 1,
wherein the first display area comprises a pixel area and a non-pixel area surrounding the pixel area, and the first light-emitting elements are located in the pixel area; and
wherein the state switching layer comprises a plurality of state switching units, and wherein at least part of the non-pixel area does not overlap the plurality of state switching units in the direction perpendicular to the display panel.

4. The display panel according to claim 3, wherein one of the first light-emitting elements overlaps a respective one of the plurality of state switching units in the direction perpendicular to the display panel.

5. The display panel according to claim 3, wherein one of the plurality of state switching units overlaps n of the first light-emitting elements in the direction perpendicular to the display panel, where n≥2.

6. The display panel according to claim 3, wherein at least two adjacent state switching units of the plurality of state switching units are connected by a communication part to form a state switching unit group.

7. The display panel according to claim 6, wherein the communication part and the plurality of state switching units are made of a same material, or the communication part is made of a material comprising a transparent conductive material.

8. The display panel according to claim 3,
wherein the plurality of state switching units comprises first state switching units and second state switching units, wherein in a direction from the second display area towards the first display area, the second state switching units are located at a side of the first state switching units facing away from the second display area; and
wherein the display panel has a first use state, in which the first state switching units are in the first state while the second state switching units are in the second state, or the first state switching units are in the second state while the second state switching units are in the first state.

9. The display panel according to claim 1, wherein:
the state switching layer comprises a first voltage terminal and a second voltage terminal;
the array layer comprises a first voltage signal line for providing a first voltage signal, and a second voltage signal line for providing a second voltage signal, and
the first voltage terminal is electrically connected to the first voltage signal line, and the second voltage terminal is electrically connected to the second voltage signal line.

10. The display panel according to claim 9,
wherein the array layer further comprises a first control unit and a second control unit, wherein the first control unit comprises an input terminal electrically connected to the first voltage signal line and an output terminal electrically connected to the first voltage terminal, and wherein the second control unit comprises an input terminal electrically connected to the second voltage signal line and an output terminal electrically connected to the second voltage terminal; and
wherein the array layer further comprises a control signal line, and wherein a control terminal of the first control unit and a control terminal of the second control unit are electrically connected to the control signal line.

11. The display panel according to claim 1, wherein the state switching layer comprises an electrochromic thin film.

12. The display panel according to claim 1, wherein the state switching layer has a reflection effect on light in the first state.

13. The display panel according to claim 1, wherein the first anode is a transparent anode and the second anode is a reflective anode.

14. The display panel according to claim 1, wherein a light transmittance of the first anode is T, where T≥60%.

15. The display panel according to claim 1, wherein the second anode comprises a first conductive layer, a reflective layer, and a second conductive layer that are sequentially stacked; and
wherein the first anode comprises the first conductive layer and/or the second conductive layer.

16. The display panel according to claim 1, wherein the optical element is located at a side of the array layer facing away from the state switching layer.

17. The display panel according to claim 1,
wherein the array layer comprises a recess located in the first display area, and the optical element is located in the recess; and
wherein the array layer comprises a plurality of pixel circuits, the plurality of pixel circuits comprises first pixel circuits electrically connected to the first light-emitting elements, and wherein the first pixel circuits do not overlap the first light-emitting elements in the direction perpendicular to the display panel.

18. The display panel according to claim 17, wherein the first light-emitting elements are electrically connected to the first pixel circuits by first wires, wherein each of the first wires comprises a first sub-wire and a second sub-wire electrically connected to each other, wherein the first sub-wire is located in the first display area, wherein at least part of the second sub-wire is located in the array layer, and wherein the first sub-wire is made of a material comprising a transparent conductive material.

19. The display panel according to claim 17, wherein the first light-emitting elements are electrically connected to the first pixel circuits by first wires, wherein each of the first wires comprises a first sub-wire and a second sub-wire electrically connected to each other, wherein the first sub-wire is located in the first display area, wherein at least part of the second sub-wire is located in the array layer, and wherein the first sub-wire and the first anode are made of a same material in a same layer.

20. A display device comprising a display panel having a display area comprising a first display area and a second display area, the display panel comprising:
   a substrate;
   an array layer located on the substrate;
   a display layer located at a side of the array layer facing away from the substrate, wherein the display layer comprises a plurality of light-emitting elements each comprising an anode, wherein a light-emitting layer and a cathode that are sequentially stacked, wherein the plurality of light-emitting elements comprises first light-emitting elements each comprising a first anode and second light-emitting elements each comprising a second anode, and wherein light transmittance of the first anode is larger than light transmittance of the second anode; wherein the first light-emitting elements are located in the first display area, and wherein the second light-emitting elements are located in the second display area;
   a state switching layer located at a side of the display layer facing away from a display surface of the display panel and located in the first display area, wherein in a direction perpendicular to the display panel, the state switching layer overlaps the first light-emitting elements; wherein the state switching layer is switchable between a first state and a second state, and the state switching layer has a smaller light transmittance in the first state than in the second state; and
   an optical element located at a side of the state switching layer that is facing away from the display layer and is located in the first display area.

* * * * *